(12) United States Patent
Kojima (10) Patent No.: US 12,396,223 B2
(45) Date of Patent: Aug. 19, 2025

(54) SEMICONDUCTOR DEVICE AND METHOD OF MANUFACTURING THE SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hidenobu Kojima, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 971 days.

(21) Appl. No.: 17/472,961

(22) Filed: Sep. 13, 2021

(65) Prior Publication Data

US 2022/0093733 A1    Mar. 24, 2022

(30) Foreign Application Priority Data

Sep. 18, 2020   (JP) .................. 2020-157831

(51) Int. Cl.
| | | |
|---|---|---|
| H10D 62/10 | (2025.01) | |
| H01L 21/304 | (2006.01) | |
| H01L 21/3065 | (2006.01) | |
| H10D 30/01 | (2025.01) | |
| H10D 30/63 | (2025.01) | |

(52) U.S. Cl.
CPC ....... *H10D 62/117* (2025.01); *H01L 21/3043* (2013.01); *H01L 21/3065* (2013.01); *H10D 30/025* (2025.01); *H10D 30/63* (2025.01)

(58) Field of Classification Search
CPC . H01L 21/3403; H01L 21/78; H01L 29/0657; H01L 33/20; H10D 62/117; H10D 30/63; H10D 30/025
See application file for complete search history.

(56) References Cited

U.S. PATENT DOCUMENTS

| | | | |
|---|---|---|---|
| 6,515,309 B1 | 2/2003 | Tohyama et al. | |
| 8,138,552 B2 * | 3/2012 | Matsuo | H01L 29/6656 257/408 |
| 9,496,193 B1 * | 11/2016 | Roesner | H01L 24/26 |
| 2003/0216009 A1 | 11/2003 | Matsuura et al. | |

(Continued)

FOREIGN PATENT DOCUMENTS

| | | |
|---|---|---|
| JP | H05-166926 A | 7/1993 |
| JP | H05-343742 A | 12/1993 |

(Continued)

*Primary Examiner* — Eric K Ashbahian
(74) *Attorney, Agent, or Firm* — Kim & Stewart LLP (57) ABSTRACT

A semiconductor device includes: a substrate having a lower surface and a side surface and the substrate containing a semiconductor material; and an electrode provided on the lower surface, wherein the side surface has a first side surface portion, a second side surface portion provided on the first side surface portion, and a third side surface portion provided on the second side surface portion, the third side surface portion protrudes in a plane parallel to the lower surface more than the second side surface portion, and the first side surface portion protrudes in a plane parallel to the lower surface more than the third side surface portion.

4 Claims, 11 Drawing Sheets

(56) References Cited

U.S. PATENT DOCUMENTS

| | | | |
|---|---|---|---|
| 2006/0194094 A1* | 8/2006 | Evertz | H01M 8/248 |
| | | | 429/511 |
| 2006/0197094 A1 | 9/2006 | Sugawara | |
| 2007/0290216 A1* | 12/2007 | Watanabe | H01L 33/30 |
| | | | 257/86 |
| 2014/0001487 A1* | 1/2014 | Nakazawa | H01L 21/046 |
| | | | 438/137 |
| 2014/0061672 A1* | 3/2014 | Wakimoto | H10D 64/111 |
| | | | 257/77 |
| 2016/0056080 A1 | 2/2016 | Takahashi et al. | |
| 2019/0081006 A1* | 3/2019 | Ozawa | H01L 23/5226 |

FOREIGN PATENT DOCUMENTS

| | | |
|---|---|---|
| JP | H06-112312 A | 4/1994 |
| JP | 2000-195827 A | 7/2000 |
| JP | 2003-332270 A | 11/2003 |
| JP | 2006-245380 A | 9/2006 |
| JP | 2008-227398 A | 9/2008 |
| JP | 2015-029062 A | 2/2015 |
| JP | 2016-058610 A | 4/2016 |
| WO | 2012/124190 A1 | 9/2012 |

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2020-157831, filed on Sep. 18, 2020, the entire contents of which are incorporated herein by reference.

FIELD

Embodiments described herein relate generally to a semiconductor device.

BACKGROUND

Semiconductor devices, such as a metal oxide semiconductor field effect transistor (MOSFET), are used in applications such as power conversion. Such semiconductor devices are formed on a semiconductor wafer and then separated into individual chips by a predetermined dicing process.

In the related art, in the dicing process, blade dicing using a dedicated blade dicer has been performed. In recent years, however, dicing using various methods such as plasma dicing has been studied.

DETAILED DESCRIPTION

Hereinafter, embodiments will be described with reference to the diagrams. In the following description, the same members and the like are denoted by the same reference numerals, and the description of the members and the like once described will be omitted as appropriate.

In this specification, in order to show the positional relationship of components and the like, the upper direction of the diagram is described as "upper" and the lower direction of the diagram is described as "lower". In this specification, the concepts of "upper" and "lower" do not necessarily indicate the relationship with the direction of gravity.

Embodiments

A semiconductor device of embodiments includes: a substrate having a lower surface and a side surface and the substrate containing a semiconductor material; and an electrode provided on the lower surface, wherein the side surface has a first side surface portion, a second side surface portion provided on the first side surface portion, and a third side surface portion provided on the second side surface portion, the third side surface portion protrudes in a plane parallel to the lower surface more than the second side surface portion, and the first side surface portion protrudes in a plane parallel to the lower surface more than the third side surface portion.

Figure 1:
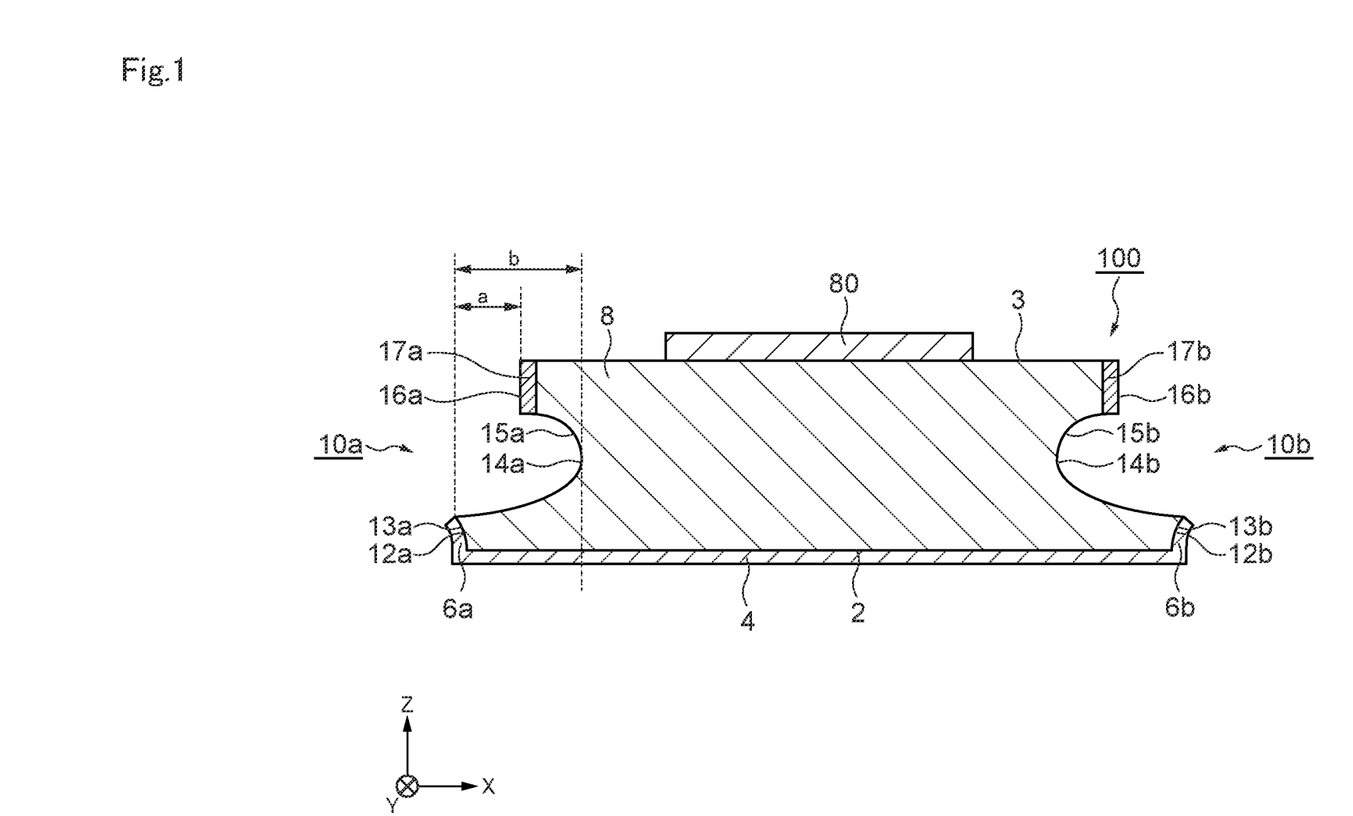
FIG. 1 is a schematic cross-sectional view of a semiconductor device of embodiments.

FIG. 1 is a schematic cross-sectional view of a semiconductor device 100 of embodiments. The semiconductor device 100 of the present embodiment is, for example, a MOSFET semiconductor chip.

The semiconductor device 100 includes a substrate 8, a lower surface electrode (an example of an electrode) 4, and an upper surface electrode 80.

The substrate 8 contains a semiconductor material. Here, examples of the semiconductor material include silicon (Si), silicon carbide (SiC), gallium arsenide (GaAs), and gallium nitride (GaN). However, the semiconductor material is not limited to these.

The substrate 8 has a lower surface 2, an upper surface 3, and a side surface 10. In FIG. 1, a side surface 10a and a side surface 10b are shown.

Here, an X direction, a Y direction perpendicular to the X direction, and a Z direction perpendicularly crossing the X and Y directions are defined. It is assumed that the lower surface 2 and the upper surface 3 are provided in parallel to the XY plane.

The lower surface electrode 4 is provided on the lower surface 2 of the substrate 8. The lower surface electrode 4 functions as, for example, a drain electrode of a MOSFET.

The upper surface electrode 80 is provided on the upper surface 3 of the substrate 8. The upper surface electrode 80 functions as, for example, a source electrode of a MOSFET.

The lower surface electrode 4 and the upper surface electrode 80 contain a metal material. Here, examples of the metal material include copper (Cu), aluminum (Al), nickel (Ni), silver (Ag), or gold (Au). However, the metal material is not limited to these.

The side surface 10 includes a first side surface portion 12, a second side surface portion 14 provided on the first side surface portion 12, and a third side surface portion 16 provided on the second side surface portion 14. In FIG. 1, a first side surface portion 12a and a first side surface portion 12b are also shown. In addition, a second side surface portion 14a and a second side surface portion 14b are shown. In addition, a third side surface portion 16a and a third side surface portion 16b are shown.

In addition, the third side surface portion 16 protrudes by a length (b−a) from the most recessed portion of the second side surface portion 14 in a plane parallel to the lower surface 2 and the upper surface 3. In addition, the first side surface portion 12 protrudes by a length b from the most recessed portion of the second side surface portion 14 in a plane parallel to the lower surface 2 and the upper surface 3.

The first side surface portion 12 has at least one first scallop 13. In the semiconductor device 100, the first side surface portion 12a has a first scallop 13a. In addition, the first side surface portion 12b has a first scallop 13b. In addition, the number of first scallops 13 is not limited to one.

The second side surface portion 14 has at least one second scallop 15. In the semiconductor device 100, the second side surface portion 14a has a second scallop 15a. In addition, the second side surface portion 14b has a second scallop 15b. In addition, the number of second scallops 15 is not limited to one.

The first scallop 13 and the second scallop 15 are formed, for example, when the substrate 8 containing Si is cut by plasma dicing. The plasma dicing herein is performed, for example, by repeating isotropic etching using fluorine (F)-based radicals, formation of a protective film containing carbon tetrafluoride ($CF_4$)-based radicals, and anisotropic etching using F-based ions. By such plasma dicing, a scallop having a shell shape is formed on the cut surface of the substrate 8.

The third side surface portion 16 has a fracture layer 17. In the semiconductor device 100, the third side surface portion 16a has a fracture layer 17a. In addition, the third side surface portion 16b has a fracture layer 17b. The fracture layer 17 is a layer in which the crystal defect density increases compared with other portions of the substrate 8 due to grinding or cutting using blade dicing, for example. On the other hand, the first side surface portion 12 and the second side surface portion 14 do not have the fracture layer 17. Therefore, the third side surface portion 16 has more fracture layers 17 than the first side surface portion 12 and the second side surface portion 14 do. In addition, the fracture layer 17 can be detected, for example, by analyzing the third side surface portion 16 with a microscope.

A metal portion 6 is provided on the first side surface portion 12. In the semiconductor device 100, a metal portion 6a is provided on the first side surface portion 12a. In addition, a metal portion 6b is provided on the first side surface portion 12b. As will be described later, the metal portion 6 is formed at the same time as the lower surface electrode 4 is formed. The metal portion 6 is electrically connected to the lower surface electrode 4. The metal portion 6 contains the same element as the lower surface electrode 4. In addition, the metal portion 6 may not be formed on the entire first side surface portion 12, or may be formed on a part of the first side surface portion 12.

Next, a method of manufacturing the semiconductor device 100 of embodiments will be described.

A method of manufacturing a semiconductor device of embodiments includes: forming a first gap having a first side surface portion and having a first width by performing first etching on a first portion on a first surface side of a semiconductor substrate, the semiconductor substrate having a first surface and a second surface opposite to the first surface; forming a second gap having a second side surface portion and having a second width by performing second etching on a second portion of the semiconductor substrate below the first gap, the second width being larger than the first width in a plane parallel to the first surface of the semiconductor substrate; forming an electrode on the first surface of the semiconductor substrate; and forming a third gap having a third side surface portion and having a third width by performing blade dicing of a third portion of the semiconductor substrate below the second gap from the second surface, and dividing the semiconductor substrate by forming the third gap, the third width being larger than the first width and smaller than the second width in the plane parallel to the first surface of the semiconductor substrate.

FIGS. 2 to 8 are schematic cross-sectional views showing steps of manufacturing the semiconductor device of embodiments.

Figure 2:
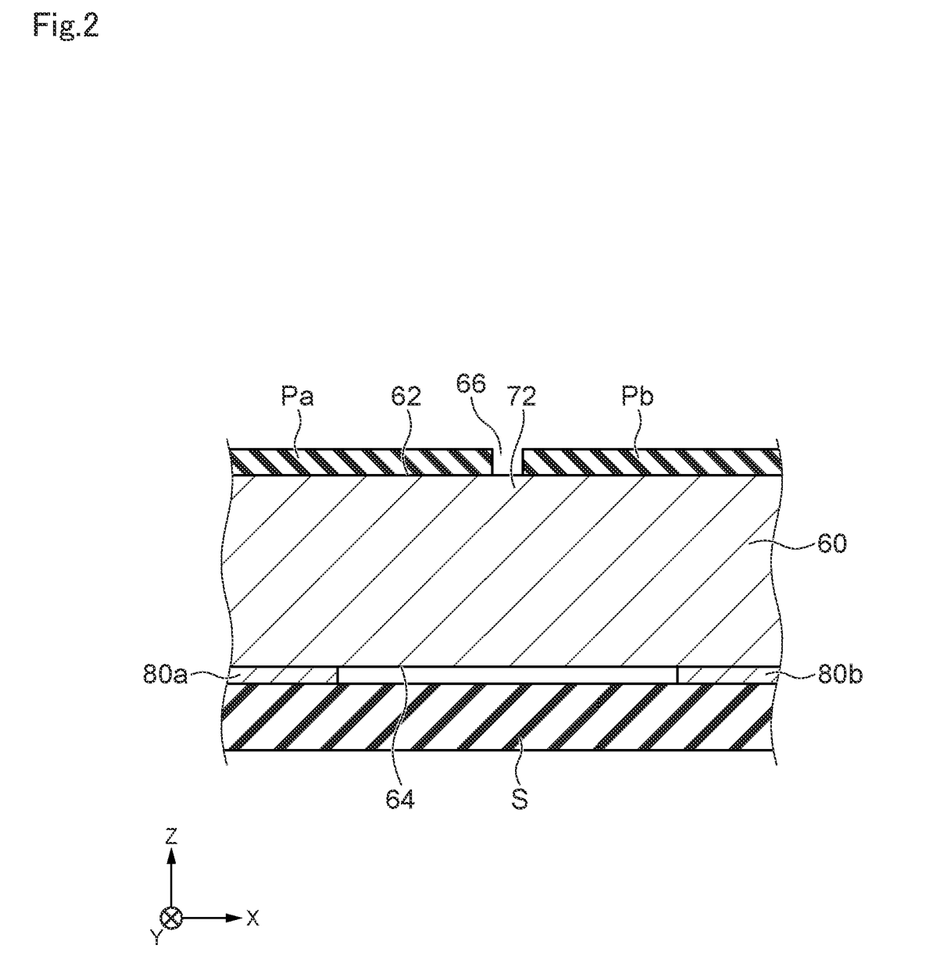
FIG. 2 is a schematic cross-sectional view showing a step of manufacturing the semiconductor device of embodiments.

A semiconductor substrate 60 is a substrate on which the semiconductor device 100 is formed. The semiconductor substrate 60 has a first surface (an example of the upper surface of the semiconductor substrate 60) 62 and a second surface (an example of the lower surface of the semiconductor substrate 60) 64. The first surface 62 is a surface that serves as the lower surface 2 of the substrate 8 of the semiconductor device 100. On the second surface 64, an upper surface electrode 80a and an upper surface electrode 80b are formed so as to be spaced apart from each other in the X direction. The second surface 64 is a surface that serves the upper surface 3 of the substrate 8 of the semiconductor device 100. In addition, a photoresist $P_a$ and a photoresist $P_b$ are formed on the first surface 62. An opening 66 is formed between the photoresist $P_a$ and the photoresist $P_b$. The opening 66 is formed so as to be disposed between the upper surface electrode 80a and the upper surface electrode 80b in the XY plane when viewed from the first surface 62 side. Here, the semiconductor substrate 60 is fixed on a support S formed of a glass plate or the like so that the second surface 64 faces down (FIG. 2).

Figure 3:
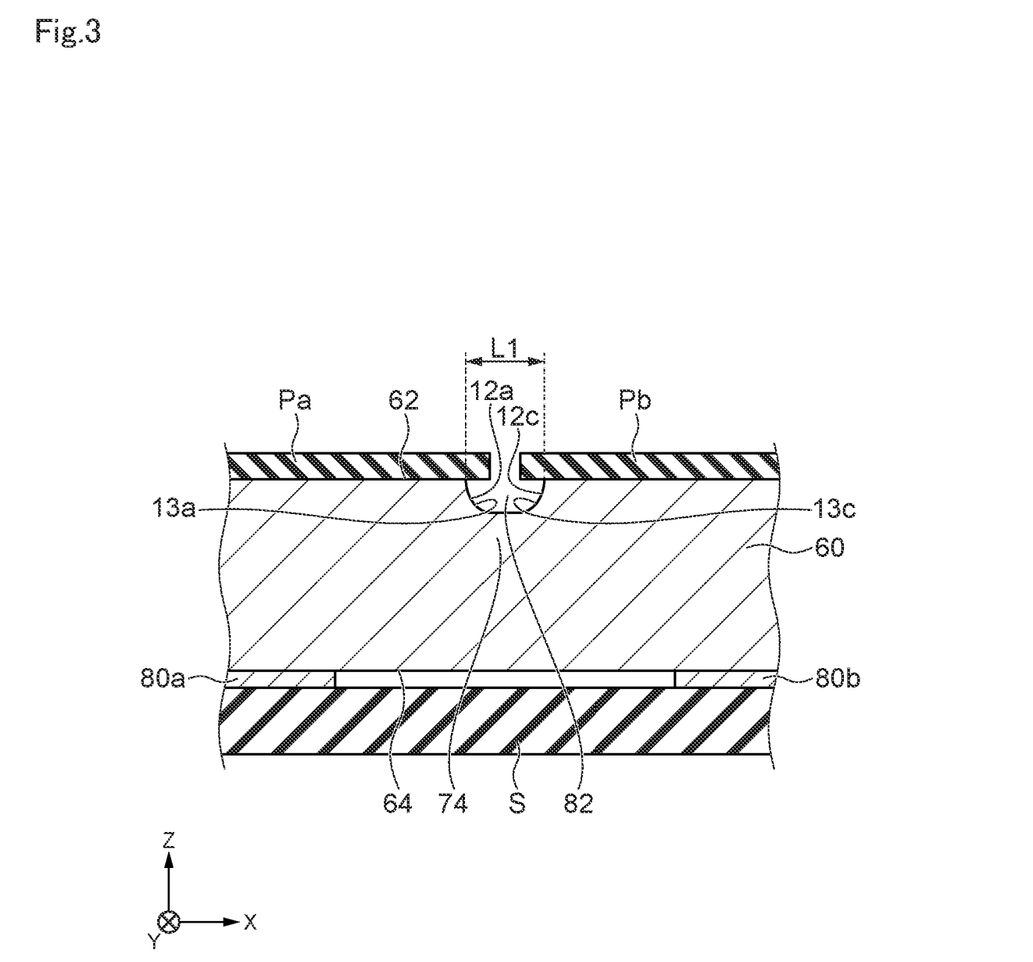
FIG. 3 is a schematic cross-sectional view showing a step of manufacturing the semiconductor device of embodiments.

Then, by performing first etching on a first portion 72 of the semiconductor substrate 60 below the opening 66, a first gap 82 having a first width $L_1$, which has the first side surface portion 12, is formed (FIG. 3). FIG. 3 shows the first side surface portion 12a and the first side surface portion 12c. Here, the first gap 82 is formed in a stripe shape in parallel to the first surface 62 and the second surface 64 of the semiconductor substrate 60 and in the depth direction of the paper surface by isotropic etching using fluorine (F)-based radicals formed of sulfur hexafluoride ($SF_6$), for example. The first scallop 13a is formed on the first side surface portion 12a. In addition, the first scallop 13c is formed on the first side surface portion 12c.

Figure 4:
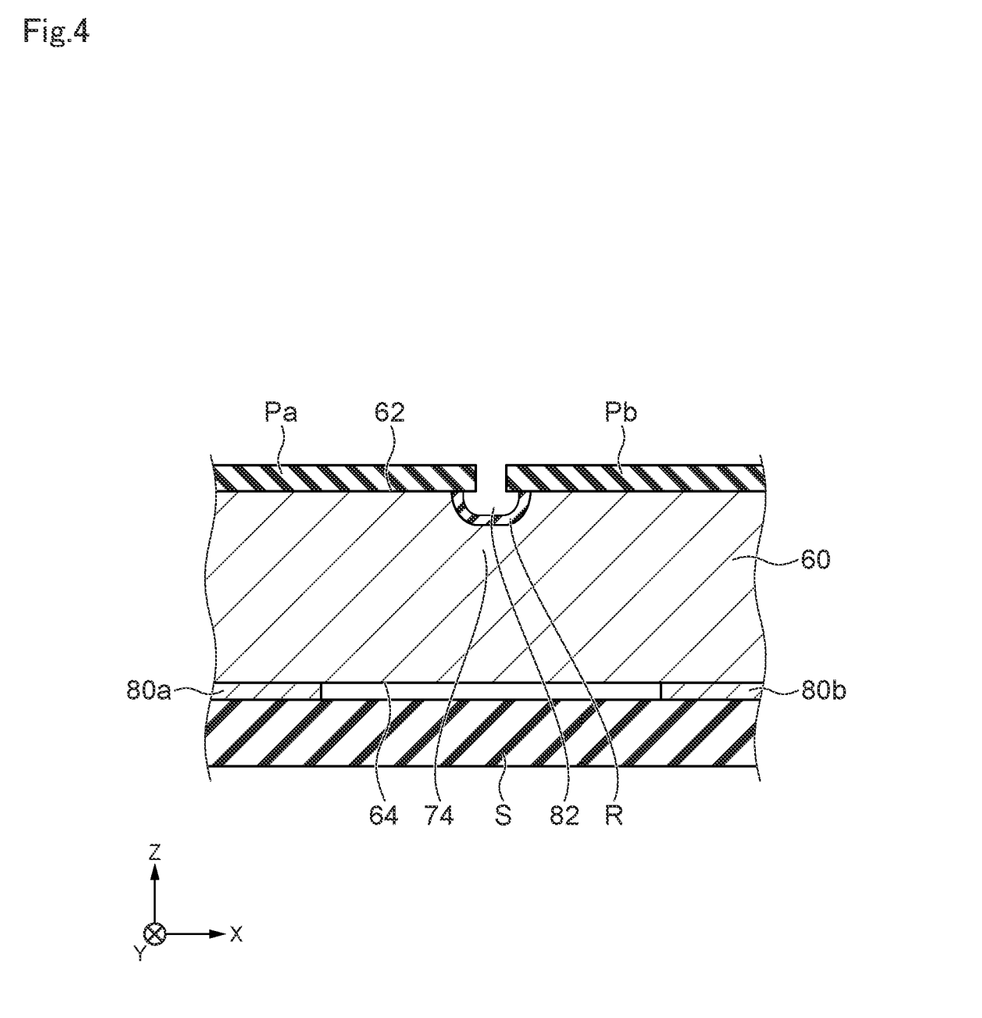
FIG. 4 is a schematic cross-sectional view showing a step of manufacturing the semiconductor device of embodiments.

Then, a protective film R is formed on the side surface and the bottom surface of the first gap 82 using carbon tetrafluoride ($CF_4$)-based radicals (FIG. 4).

Figure 5:
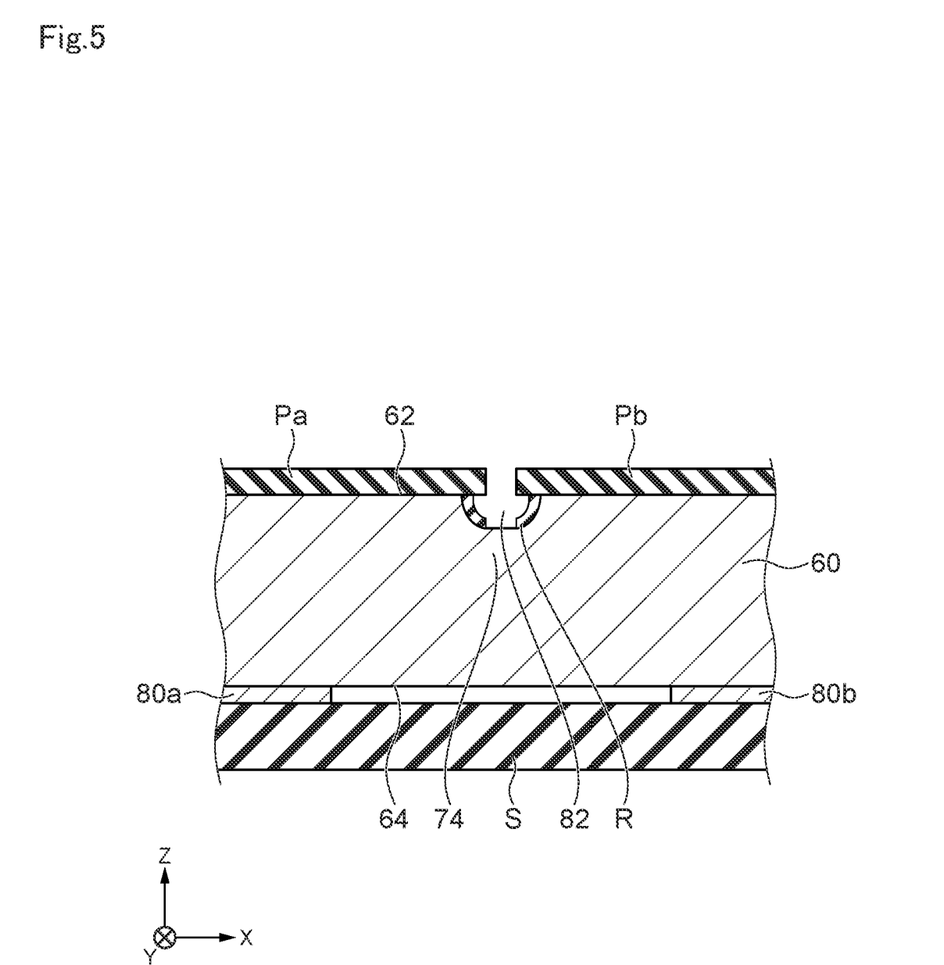
FIG. 5 is a schematic cross-sectional view showing a step of manufacturing the semiconductor device of embodiments.

Then, a part of the protective film R formed on the bottom surface of the first gap 82 is removed by anisotropic etching using, for example, F-based ions formed of sulfur hexafluoride ($SF_6$) (FIG. 5).

In addition, by repeating isotropic etching and anisotropic etching, it is possible to form the first side surface portion 12 having a plurality of first scallops 13.

Figure 6:
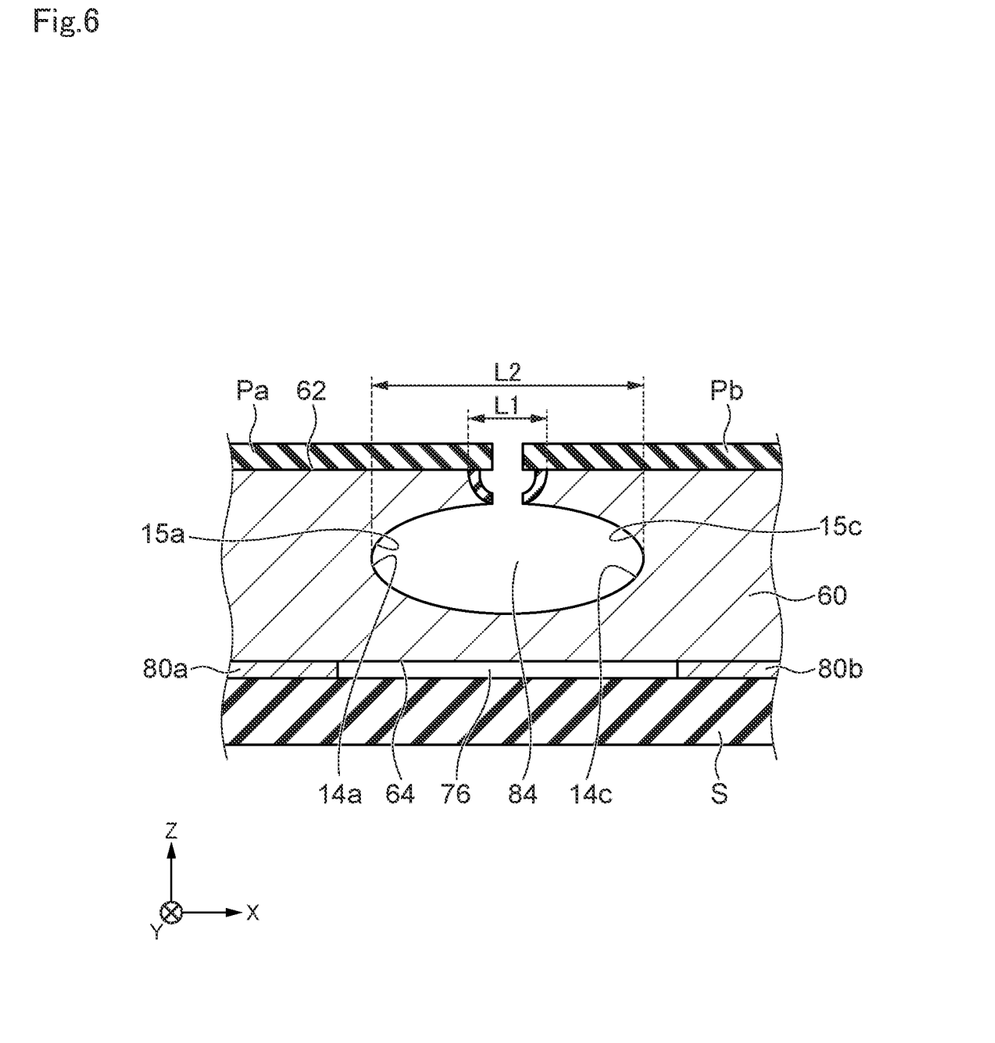
FIG. 6 is a schematic cross-sectional view showing a step of manufacturing the semiconductor device of embodiments.

Then, by performing second etching on a second portion 74 below the first gap 82, a second gap 84 having a second width $L_2$, which has the second side surface portion 14, is formed below the first gap 82 (FIG. 6). FIG. 6 shows the second side surface portion 14a and the second side surface portion 14c. Here, the second gap 84 is formed in a stripe shape in parallel to the first surface 62 and the second surface 64 of the semiconductor substrate 60 and in the depth direction of the paper surface by isotropic etching using fluorine (F)-based radicals formed of $SF_6$, for example. The second scallop 15a is formed on the second side surface portion 14a. In addition, the second scallop 15c is formed on the second side surface portion 14c.

In addition, for example, after the state shown in FIG. 6, a protective film is formed on the side surface and the bottom surface of the second gap 84 by using carbon tetrafluoride ($CF_4$)-based radicals. Then, a part of the protective film R formed on the bottom surface of the second gap 84 is removed by anisotropic etching using, for example, F-based ions formed of sulfur hexafluoride ($SF_6$). By repeating the processes of isotropic etching, protective film formation, and anisotropic etching, it is possible to form a plurality of second scallops 15 on the second side surface portion 14.

The time of isotropic etching used for forming the second gap 84 is preferably longer than the time of isotropic etching used for forming the first gap 82.

Figure 7:
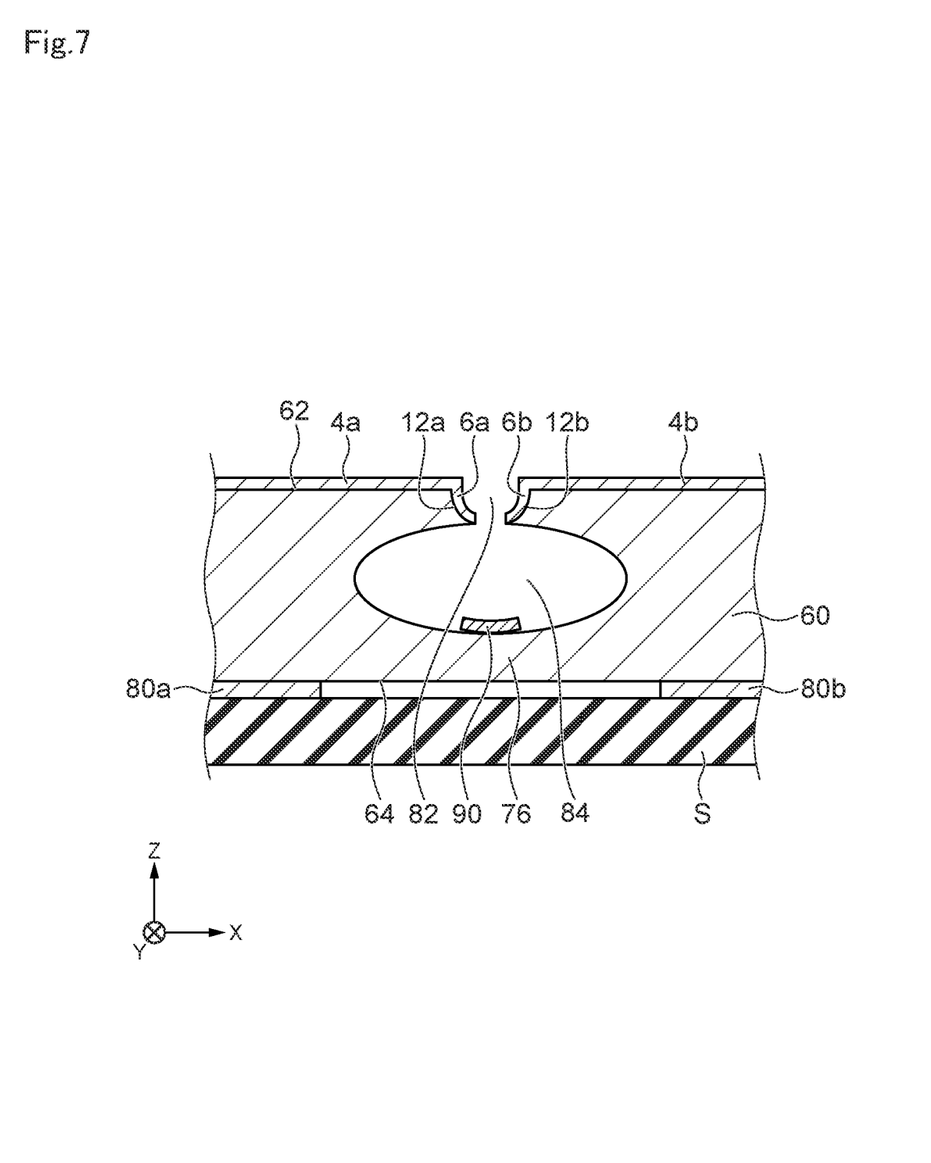
FIG. 7 is a schematic cross-sectional view showing a step of manufacturing the semiconductor device of embodiments.

Then, the photoresist P and the protective film R are removed. Then, after cleaning the surface on which the photoresist P and the protective film R are formed, the lower surface electrode 4 is formed on the first surface 62 using, for example, a sputtering apparatus (FIG. 7). In FIG. 7, the lower surface electrode 4a and the lower surface electrode 4b are formed. In addition, at the same time, the metal portion 6 containing the same material as the lower surface electrode 4 is formed on the first side surface portion 12. In FIG. 7, the metal portion 6a is formed on the first side surface portion 12a. In addition, the metal portion 6b is formed on the first side surface portion 12b. In addition, at the same time, a metal material waste 90 containing the same material as the lower surface electrode 4 and the metal portion 6 is formed on the bottom surface of the second gap 84.

Figure 8:
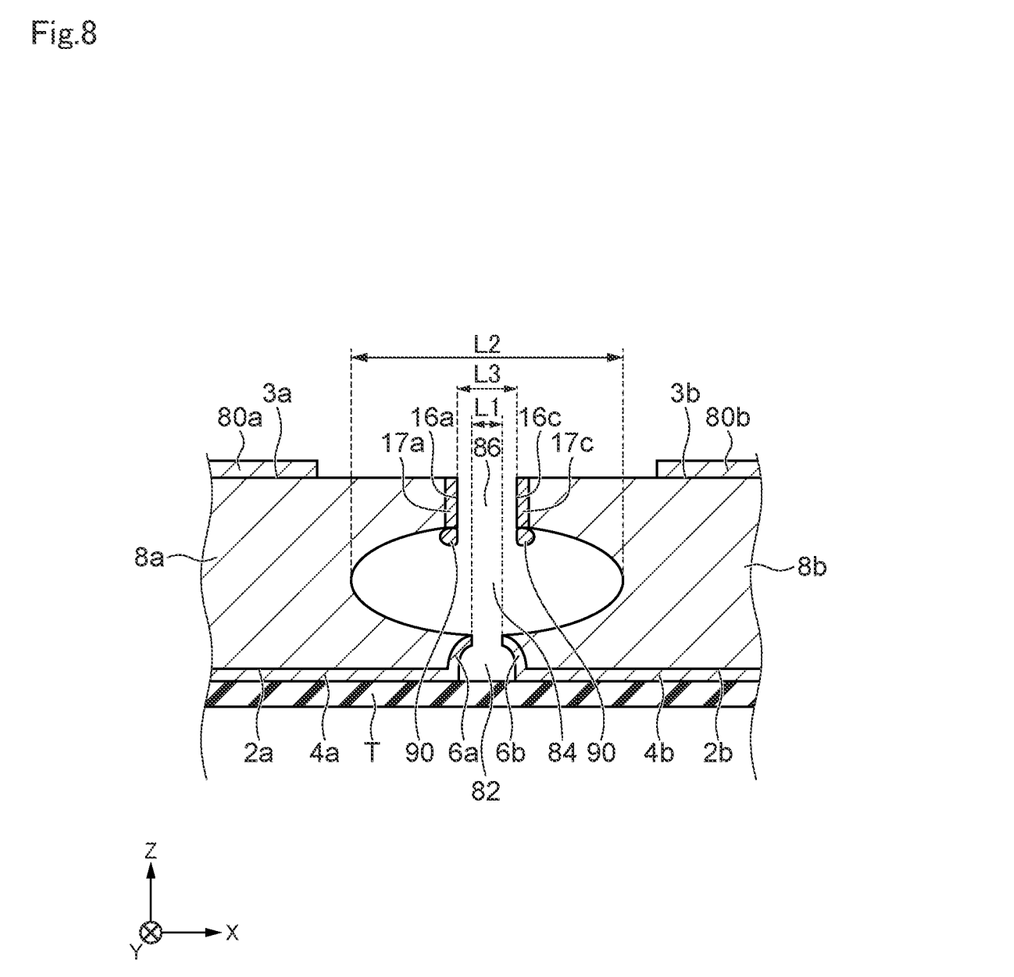
FIG. 8 is a schematic cross-sectional view showing a step of manufacturing the semiconductor device of embodiments.

Then, the semiconductor substrate 60 is peeled off from the support S, and the semiconductor substrate 60 is fixed so that the lower surface electrode 4 is bonded to a dicing tape T. Then, a third portion 76 of the semiconductor substrate 60 is diced from the side of the second surface 64 by blade dicing. In addition, FIG. 7 shows that the third portion 76 is provided below the second gap 84. As a result, a third gap 86 having the third side surface portion 16 is formed (FIG. 8). The third gap 86 is formed in a stripe shape in parallel to the first surface 62 and the second surface 64 of the semiconductor substrate 60 and in the depth direction of the paper surface. FIG. 8 shows the third side surface portion 16a and the third side surface portion 16b. Since the third side surface portion 16 is formed by blade dicing, the fracture layer 17a is formed on the third side surface portion 16a and the fracture layer 17b is formed on the third side surface portion 16b. Here, the width of the blade is selected so that the width $L_3$ of the third gap 86 is larger than the first width $L_1$ of the first gap 82 and smaller than the second width $L_2$ of the second gap 84.

By cutting using such blade dicing, the semiconductor substrate 60 becomes the substrate 8a and the substrate 8b. The first surface 62 of the semiconductor substrate 60 becomes the lower surface 2a and the lower surface 2b. In addition, the second surface 64 of the semiconductor substrate 60 becomes the upper surface 3a and the upper surface 3b. In addition, the metal material waste 90 is cut by blade dicing. At this time, as shown in FIG. 8, a part of the metal material waste 90 may remain. In this manner, the semiconductor device 100 is obtained.

Next, the function and effect of the semiconductor device of embodiments and the method of manufacturing the semiconductor device will be described.

Figure 9:
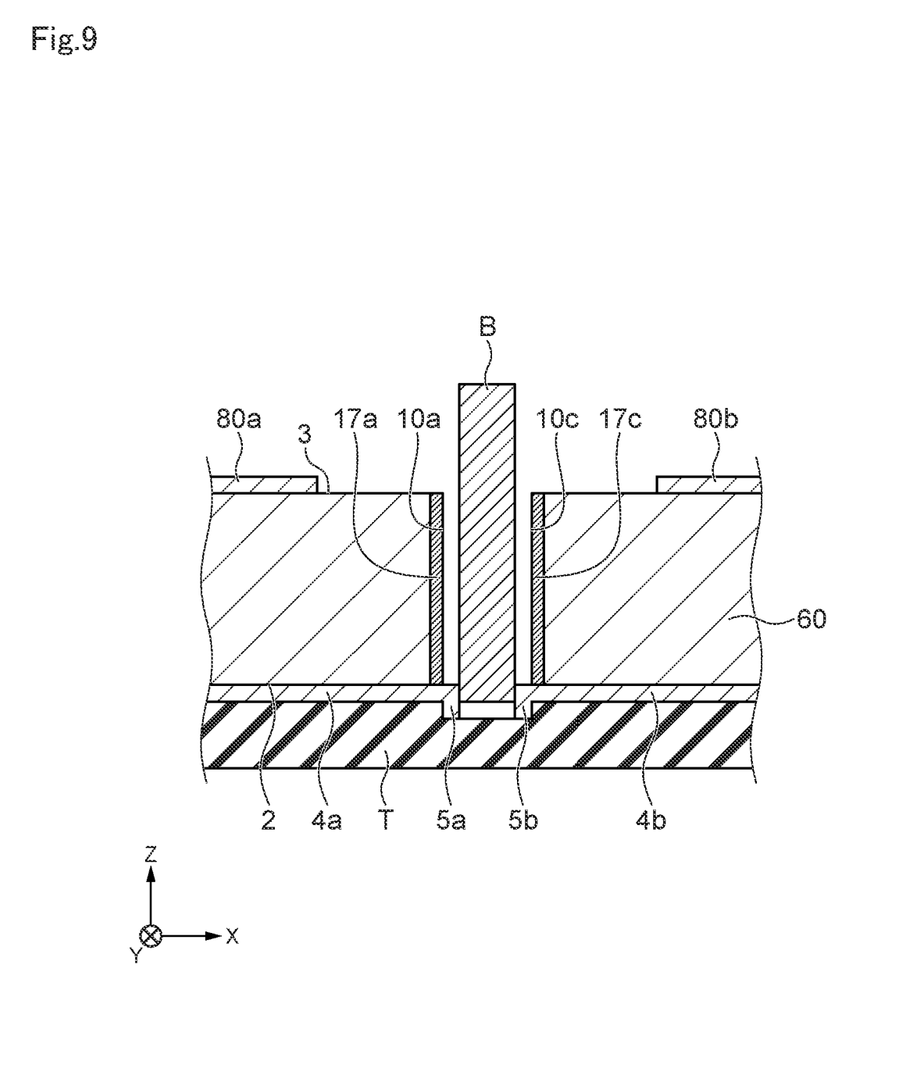
FIG. 9 is a schematic cross-sectional view showing a step of manufacturing a semiconductor device as a comparative form.
Figure 10:
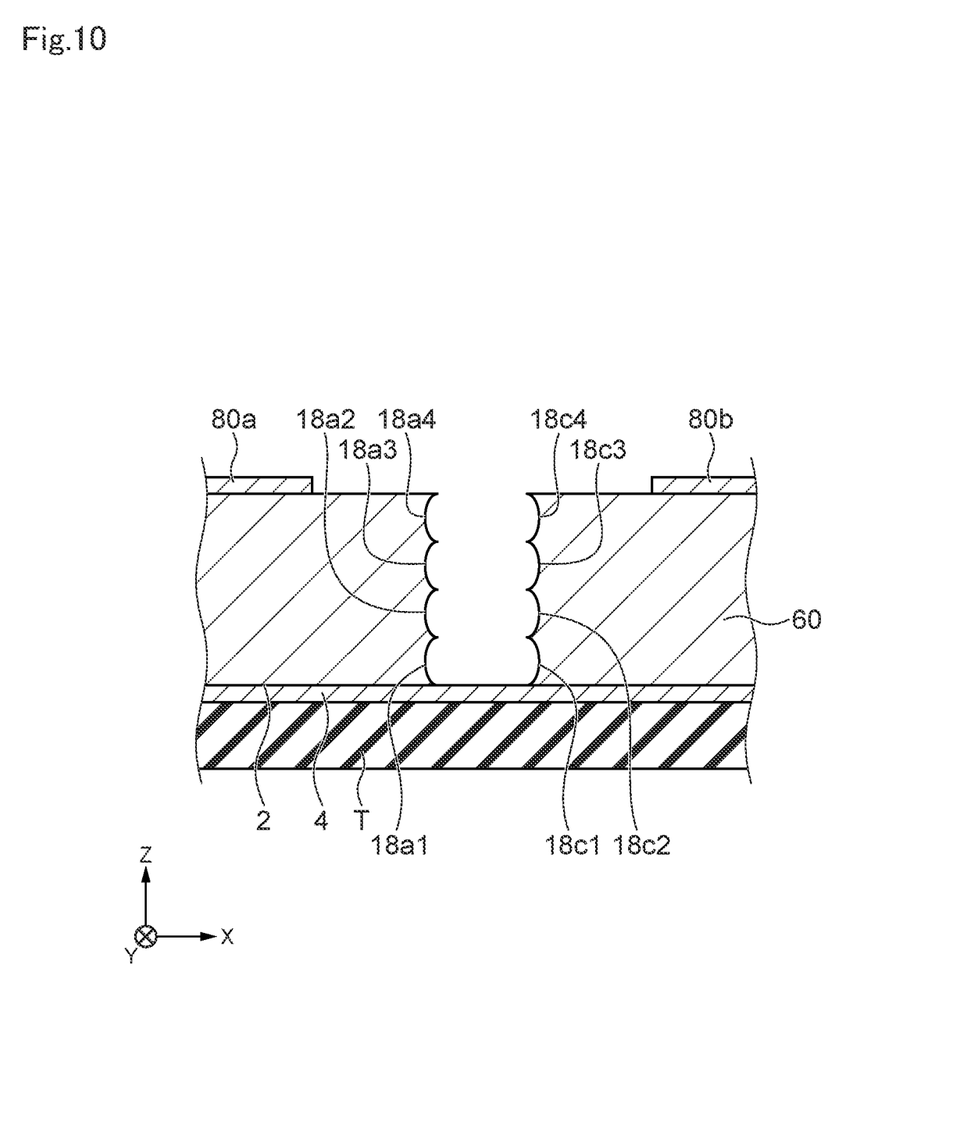
FIG. 10 is a schematic cross-sectional view showing a step of manufacturing a semiconductor device as a comparative form.
Figure 11:
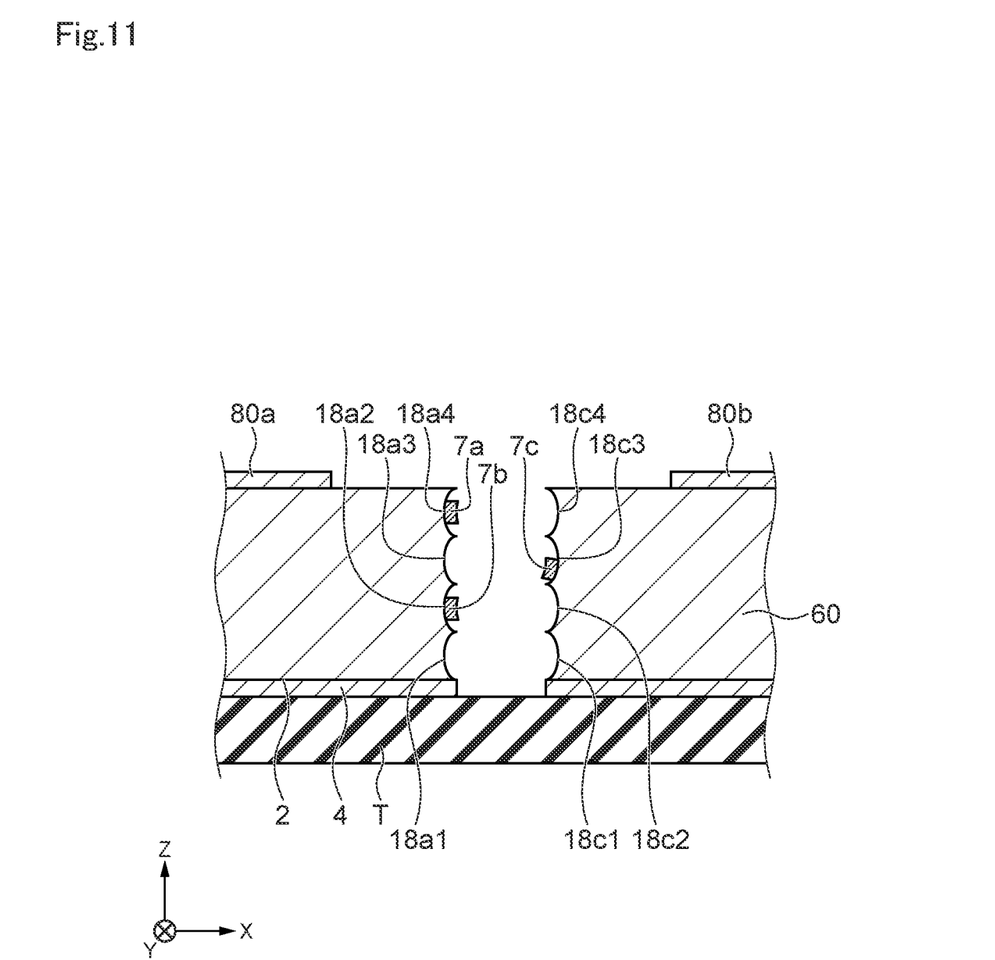
FIG. 11 is a schematic cross-sectional view showing a step of manufacturing a semiconductor device as a comparative form.

FIGS. 9 to 11 are schematic cross-sectional views showing steps of manufacturing a semiconductor device as a comparative form.

FIG. 9 shows a manufacturing step in which blade dicing using a blade B is performed. In the case of cutting the semiconductor substrate 60 having the lower surface electrode 4 provided on the lower surface 2 by using the blade B, a burr 5 is generated when the lower surface electrode 4 is cut by the blade B. In FIG. 9, a burr 5a and a burr 5b are shown. Since the burr 5 bites into the dicing tape T, there is a problem that, when a semiconductor device is picked up using an adsorption collet or the like after the end of the dicing, the semiconductor device cannot be picked up because the semiconductor device is not properly peeled off from the dicing tape T. In addition, there is a problem that the lower surface electrode 4 is peeled off from the lower surface 2, and the peeling off starts because the burr 5 bites into the dicing tape T. In addition, when mounting the semiconductor device on a die pad or the like (not shown) using solder (not shown), there is a problem that voids in the solder are caught in the portion of the burr 5 and accordingly the voids cannot be removed.

FIG. 10 shows a manufacturing step using plasma dicing. In the case of plasma dicing, for example, as shown in FIG. 10, a scallop $18a_1$, a scallop $18a_2$, a scallop $18a_3$, a scallop $18a_4$, a scallop $18c_1$, a scallop $18c_2$, a scallop $18c_3$, and a scallop $18c_4$ are formed. However, plasma dicing has a problem that the lower surface electrode 4 containing a metal material cannot be diced.

FIG. 11 shows a manufacturing step in which the lower surface electrode 4 is diced by laser dicing after the manufacturing step using plasma dicing shown in FIG. 10. It is possible to dice the lower surface electrode 4 by laser dicing. However, a part of the evaporated metal contained in the lower surface electrode 4 is reattached. As a result, for example, a metal deposit 7a, a metal deposit 7b, and a metal deposit 7c are formed on the scallop 18. In this case, there is a problem that, when mounting the semiconductor device on a die pad or the like (not shown), a solder (not shown) bonded to the lower surface electrode 4 moves to the upper surface 3 via the metal deposit 7 to cause a short circuit between the lower surface electrode 4 and the upper surface electrode 80 and accordingly, the semiconductor device malfunctions.

Therefore, in the method of manufacturing the semiconductor device of embodiments, after forming the first gap 82 having the first width $L_1$ from the side of the first surface 62 by using plasma dicing, the second gap 84 having the second width $L_2$ larger than the first width $L_1$ is further formed using plasma dicing. Then, the lower surface electrode 4 is formed on the first surface 62. That is, the lower surface electrode 4 is formed after a part of the semiconductor substrate 60 is cut in advance by using plasma dicing. In this manner, since the lower surface electrode 4 is not cut by the blade B, the burr 5 is not generated. Here, the reason why the second gap 84 having the second width $L_2$ larger than the first width $L_1$ is formed below the first gap 82 having the first width $L_1$ is that, if the first width $L_1$ of the first gap 82 is too large, too much metal material waste 90 is formed on the bottom surface of the first gap 82 when the lower surface electrode 4 is formed and accordingly, the lower surface electrode 4 and the upper surface electrode 80 are short-circuited to cause a problem that the semiconductor device malfunctions.

Then, by performing blade dicing of the third gap 86 below the second gap 84 from the second surface 64, the third gap 86 having the third width $L_3$, which is larger than the first width $L_1$ and smaller than the second width $L_2$, is formed on the second surface 64 of the substrate 8.

Here, the upper surface electrode 80 is already formed on the second surface 64. If plasma dicing is attempted to form the third gap 86, the plasma dicing is performed on the upper surface electrode 80, so that contamination in the chamber of the plasma dicing apparatus occurs due to the metal material contained in the upper surface electrode 80. Then, the etching rate of plasma dicing decreases. For this reason, it is difficult to use plasma dicing in forming the third gap 86.

In addition, when laser dicing is performed to form the third gap 86, the metal portion 6, a part of the lower surface electrode 4, or the metal material waste 90 evaporates and adheres to the side surface 10 as the metal deposit 7. As a result, a problem can occur that a solder (not shown) bonded to the lower surface electrode 4 moves to the upper surface 3 via the metal deposit 7 to cause a short circuit between the lower surface electrode 4 and the upper surface electrode 80 and accordingly, the semiconductor device malfunctions. For this reason, it is difficult to use laser dicing in forming the third gap 86.

Therefore, blade dicing is appropriate for forming the third gap 86.

In addition, the width of the blade is selected so that the width $L_3$ of the third gap 86 is smaller than the width $L_2$ of the second gap 84. This is because the semiconductor substrate 60 can be cut if a third gap 86 has a width equal to or smaller than the width $L_2$ of the second gap 84. In addition, the width of the blade is selected so that the width $L_3$ of the third gap 86 is larger than the width $L_1$ of the first gap 82. This is because the width of the metal material waste 90 is almost the same as the width $L_1$ of the first gap 82 and accordingly, the metal material waste 90 can be easily cut.

The time of isotropic etching used for forming the second gap 84 is preferably longer than the time of isotropic etching used for forming the first gap 82. This is because the width $L_2$ of the second gap 84 can be made larger than the width $L_1$ of the first gap 82.

The side surface of the semiconductor device 100 manufactured as described above has the first side surface portion 12, the second side surface portion 14 provided on the first side surface portion 12, and the third side surface portion 16 provided on the second side surface portion 14. The third side surface portion 16 protrudes from the second side surface portion 14 in a plane parallel to the lower surface 2, and the first side surface portion 12 protrudes from the third side surface portion 16 in a plane parallel to the lower surface 2.

According to the semiconductor device of embodiments, it is possible to provide a highly reliable semiconductor device.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate having a lower surface and a side surface and the substrate containing a semiconductor material; and
   an electrode provided on the lower surface,
   wherein the side surface has a first side surface portion, a second side surface portion provided on the first side surface portion, and a third side surface portion provided on the second side surface portion,
   the third side surface portion protrudes in a plane parallel to the lower surface more than the second side surface portion,
   the first side surface portion protrudes in a plane parallel to the lower surface more than the third side surface portion,
   a metal portion is provided on the first side surface portion, and
   the substrate is exposed on the second side surface portion.

2. The semiconductor device according to claim 1, wherein the third side surface portion has more fracture layers than the first side surface portion and the second side surface portion do.

3. The semiconductor device according to claim 1, wherein the first side surface portion has at least one first scallop.

4. The semiconductor device according to claim 1, wherein the second side surface portion has at least one second scallop.

* * * * *